(12) United States Patent
Na

(10) Patent No.: US 12,223,869 B2
(45) Date of Patent: Feb. 11, 2025

(54) DISPLAY DEVICE

(71) Applicant: Samsung Display Co., LTD., Yongin-si (KR)

(72) Inventor: Jisu Na, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/423,730

(22) Filed: Jan. 26, 2024

(65) Prior Publication Data

US 2024/0265837 A1    Aug. 8, 2024

(30) Foreign Application Priority Data

Feb. 7, 2023 (KR) .......................... 10-2023-0016176

(51) Int. Cl.
| | |
|---|---|
| G09G 3/00 | (2006.01) |
| G09G 3/3233 | (2016.01) |
| H10K 59/131 | (2023.01) |
| H10K 59/80 | (2023.01) |

(52) U.S. Cl.
CPC ........... *G09G 3/006* (2013.01); *G09G 3/3233* (2013.01); *H10K 59/131* (2023.02); *H10K 59/873* (2023.02); *G09G 2300/0408* (2013.01); *G09G 2300/0819* (2013.01); *G09G 2300/0842* (2013.01); *G09G 2330/021* (2013.01); *G09G 2330/12* (2013.01)

(58) Field of Classification Search
None
See application file for complete search history.

(56) References Cited

U.S. PATENT DOCUMENTS

| | | | |
|---|---|---|---|
| 2016/0307971 A1* | 10/2016 | Jeon | ................. H01L 22/30 |
| 2019/0057632 A1* | 2/2019 | Kim | ................. G09G 3/3266 |
| 2019/0157607 A1* | 5/2019 | Kim | ................. H10K 59/131 |
| 2021/0359069 A1* | 11/2021 | Wang | ................. H10K 50/844 |

* cited by examiner

*Primary Examiner* — Nicholas J Lee
(74) *Attorney, Agent, or Firm* — CANTOR COLBURN LLP

(57) ABSTRACT

A display device includes: a substrate including a display area where pixels are arranged and a non-display area positioned around the display area; first crack detection lines disposed in the non-display area; a first dam positioned between the first crack detection lines and the display area; a second dam between the first dam and the first crack detection lines and including sub-layers; a common voltage line disposed in the non-display area, and which provides a common voltage to the pixels, and includes a concave part defined at an edge of the common voltage line facing the first crack detection lines; a second crack detection line electrically connected to the first crack detection lines, positioned between the first crack detection lines and the display area, and including a first line part and a first connection part contacting the first line part through a first contact hole overlapping one of the sub-layers.

20 Claims, 10 Drawing Sheets

DISPLAY DEVICE

This application claims priority to Korean Patent Application No. 10-2023-0016176, filed on Feb. 7, 2023, and all the benefits accruing therefrom under 35 U.S.C. § 119, the content of which in its entirety is herein incorporated by reference.

BACKGROUND

1. Technical Field

Embodiments provide generally to a display device. More particularly, embodiments relate to a display device that provides visual information.

2. Description of the Related Art

With the development of information technology, the importance of a display device, which is a connection medium between a user and information, has been highlighted. For example, the use of a display device such as a liquid crystal display device, an organic light emitting display device, a plasma display device, and the like is increasing.

SUMMARY

Embodiments provide a display device with improved electrostatic discharge.

A display device according to embodiments of the present disclosure includes: a substrate including a display area in which a plurality of pixels are arranged and a non-display area positioned around the display area; a plurality of first crack detection lines disposed in the non-display area on the substrate; a first dam positioned between the first crack detection lines and the display area; a second dam positioned between the first dam and the first crack detection lines and including a plurality of sub-layers; a common voltage line disposed in the non-display area on the substrate, and which provides a common voltage to the pixels, and includes a concave part defined at an edge of the common voltage line facing the first crack detection lines; and a second crack detection line electrically connected to the first crack detection lines, positioned between the first crack detection lines and the display area, and including a first line part and a first connection part contacting the first line part through a first contact hole overlapping one of the sub-layers in a plan view.

In an embodiment, the concave part may overlap at least a part of the second crack detection line in the plan view.

In an embodiment, the common voltage line may overlap an entirety of the first dam and overlap a part of the second dam in the plan view. The concave part may not overlap the first dam and may partially overlap the second dam in the plan view.

In an embodiment, the second crack detection line may further include a second line part spaced apart from the first line part and a second connection part contacting the second line part through a second contact hole overlapping the one of the sub-layers in the plan view.

In an embodiment, each of the first and second line parts may at least partially overlap the second dam and does not overlap the first dam in the plan view.

In an embodiment, the display device may further include: a driver disposed in the non-display area on the substrate. The second crack detection line may further include a bridge pattern connecting the first connection part to the second connection part. Each of the first and second connection parts may contact the bridge pattern through a contact hole in the driver.

In an embodiment, the first and second contact holes may overlap the concave part in the plan view.

In an embodiment, the sub-layers of the second dam may include: a first sub-layer, a second sub-layer disposed on the first sub-layer, and a third sub-layer disposed on the second sub-layer. Each of the first, second, and third sub-layers may include an organic material.

In an embodiment, the first sub-layer may cover each of the first and second line parts.

In an embodiment, the first sub-layer may extend to cover the first and second contact holes.

In an embodiment, the display device may further include: a first active pattern disposed in the display area on the substrate, a first gate electrode disposed on the first active pattern, a second gate electrode disposed on the first gate electrode, a second active pattern disposed on the second gate electrode, a third gate electrode disposed on the second active pattern, a source electrode and a drain electrode disposed on the third gate electrode, and a connection electrode disposed on the source electrode and the drain electrode.

In an embodiment, each of the first and second line parts may be disposed in a same layer as the source electrode and the drain electrode. Each of the first and second connection parts may be disposed in a same layer as the first gate electrode. Each of the first crack detection lines may be disposed in a same layer as the second gate electrode.

In an embodiment, the common voltage line may include a first layer disposed in a same layer as the source electrode and the drain electrode and a second layer disposed in a same layer as the connection electrode.

In an embodiment, the concave part may be defined only in the first layer of the common voltage line and the second layer of the common voltage line may overlap the first and second contact holes in the plan view.

In an embodiment, the first crack detection lines may be disposed in a different layer from the second crack detection lines.

In an embodiment, the first crack detection lines may be disposed in a same layer as each other.

A display device according to embodiments of the present disclosure includes: a substrate including a display area in which a plurality of pixels are arranged and a non-display area positioned around the display area; a driver disposed in the non-display area on the substrate; a plurality of first crack detection lines disposed in the non-display area on the substrate, where at least a part of each of the first crack detection lines is adjacent to a side of the driver and extends in parallel with an edge of the substrate; a first dam positioned between the first crack detection lines and the display area; a second dam positioned between the first dam and the first crack detection lines and including a plurality of sub-layers; a common voltage line disposed in the non-display area on the substrate, and which provides a common voltage to the pixels and includes a concave part defined at an edge of the common voltage line facing the first crack detection lines; and a second crack detection line electrically connected to the first crack detection lines, positioned between the first crack detection lines and the display area, and including a first line part and a first connection part contacting the first line part through a first contact hole overlapping one of the sub-layers in a plan view.

In an embodiment, the common voltage line may overlap an entirety of the first dam and overlap a part of the second dam in the plan view. The concave part may overlap at least a part of the second crack detection line in a plan view. The concave part may not overlap the first dame and may partially overlap the second dam in the plan view.

In an embodiment, the second crack detection line may further include: a second line part spaced apart from the first line part; and a second connection part contacting the second line part through a second contact hole overlapping the one of the sub-layers in the plan view.

In an embodiment, the first and second contact holes may overlap the concave part in the plan view.

A display device according to an embodiment of the present disclosure may include a plurality of first crack detection lines disposed in a non-display area, a first dam positioned between the first crack detection lines and the display area, a second dam positioned between the first dam and the first crack detection lines and including a plurality of sub-layers, a common voltage line, a concave part defined at an edge of the common voltage line facing the first crack detection lines, and a second crack detection line electrically connected to the first crack detection lines and including a line part and a connection part contacting the line part through a contact hole overlapping any one among the sub-layers. Accordingly, defects due to electrostatic discharge generated in a crack detection line can be effectively improved. In addition, the dead space of the display device can be effectively reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
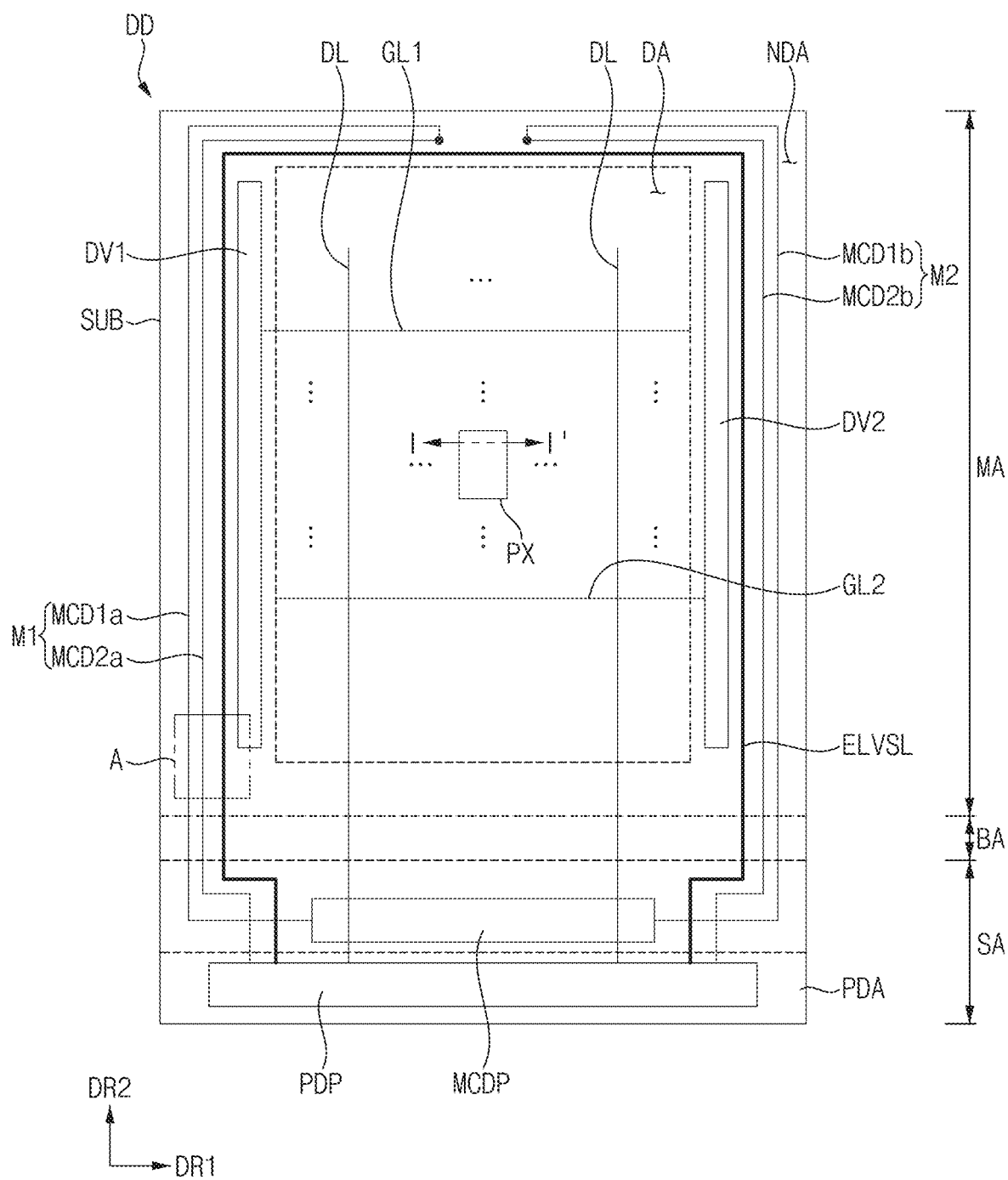
FIG. 1 is a plan view illustrating a display device according to an embodiment of the present disclosure.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, a display device according to embodiments of the present disclosure will be explained in detail with reference to the accompanying drawings. The same reference numerals are used for the same components in the drawings, and redundant descriptions of the same components will be omitted.

Figure 2:
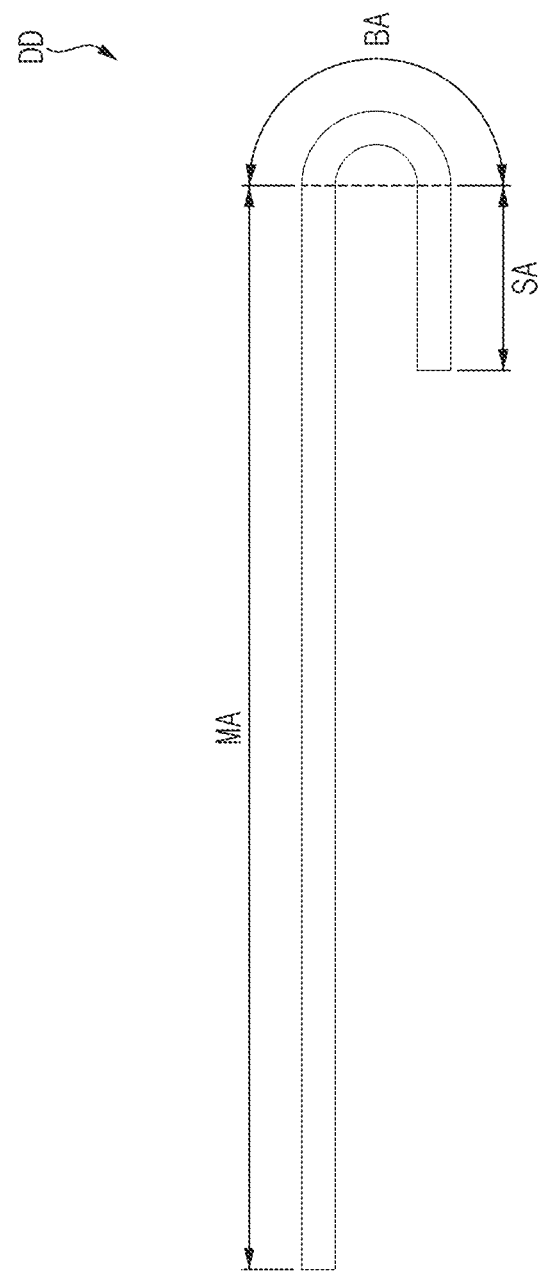
FIG. 2 is a cross-sectional view illustrating a bent state of the display device of FIG. 1.

FIG. 1 is a plan view illustrating a display device according to an embodiment of the present disclosure. FIG. 2 is a cross-sectional view illustrating a bent state of the display device of FIG. 1. As used herein, the "plan view" is a view in a thickness direction DR3 (see FIG. 4) of the substrate SUB.

Referring to FIG. 1, a display device DD according to an embodiment may include a substrate SUB, a pad portion PDP, a crack detection circuit portion MCDP, a first crack detection portion M1, a second crack detection portion M2, a common voltage line ELVSL, a data line DL, a first driver DV1, a second driver DV2, a first gate line GL1, and a second gate line GL2.

The display device DD may have a rectangular planar shape. However, embodiments of the present disclosure are not limited thereto, and the display device DD may have various planar shapes.

The substrate SUB may include a main area MA, a bending area BA, and a sub area SA. The main area MA may be flat. The main area MA may include display area DA and a part of the non-display area NDA.

The display area DA may be defined as an area capable of displaying an image by generating light or adjusting transmittance of light provided from an external light source. The non-display area NDA may be defined as an area not displaying an image. In addition, the non-display area NDA may be positioned around the display area DA. In an embodiment, for example, the non-display area NDA may surround an entirety of the display area DA.

The bending area BA may be positioned on at least one side of the main area MA. As shown in FIG. 2, the bending area BA may be bent with respect to a bending axis extending in the first direction DR1. When the bending area BA is bent with respect to the bending axis, the main area MA may overlap the sub area SA. The display device DD may be provided in a shape in which the bending area BA is bent with respect to the bending axis. The sub area SA may be parallel to the main area MA. The sub area SA may extend from one side of the bending area BA in a direction opposite to a second direction DR2. Each of the sub area SA and the bending area BA may include a part of the non-display area NDA. In addition, a pad area PDA may be positioned in the sub area SA.

A plurality of pixels PX may be disposed in the display area DA. Each of the plurality of pixels PX may emit light. As each of the plurality of pixels PX emits light, the display area DA may display an image. In an embodiment, for example, the plurality of pixels PX may be arranged in a matrix form along the first direction DR1 and the second direction DR2 crossing the first direction DR1.

One pixel PX may display one predetermined basic color. In other words, one pixel PX may be a minimum unit capable of displaying colors independent of the other pixels PX. In an embodiment, for example, one pixel PX may display any one color among red, green, and blue.

Lines connected to the plurality of pixels PX may be further disposed in the display area DA. In an embodiment, for example, the lines include a plurality of data lines DL connected to the plurality of pixels PX to provide data voltages, a plurality of gate lines GL1 and GL2 connected to the plurality of pixels PX to provide gate signals, and the like. Each of the data lines DL may extend in the second direction DR2, and each of the gate lines GL1 and GL2 may extend in the first direction DR1.

The first and second drivers DV1 and DV2 for driving the plurality of pixels PX may be disposed in the non-display area NDA. Specifically, the first driver DV1 may be disposed in the non-display area NDA adjacent to a left side of the display area DA, and the second driver DV2 may be disposed in the non-display area NDA adjacent to a right side of the display area DA. In an embodiment, for example, each of the first and second drivers DV1 and DV2 may be a gate driver connected to the plurality of gate wires GL1 and GL2 to provide a gate signal to the plurality of pixels PX. Alternatively, either of the first driver DV1 and the second driver DV2 may be omitted.

The pad portion PDP may be disposed in the pad area PDA on the substrate SUB. A driving chip or a circuit board may be electrically connected to the pad part PDP. The driving chip may convert a digital data signal among driving signals into an analog data signal and provide the converted analog data signal (i.e., the data voltage) to the plurality of pixels PX. In an embodiment, for example, the driving chip may be a data driver. For example, the circuit board may receive various signals and voltages provided to the plurality of pixels PX.

The common voltage line ELVSL may be disposed in the non-display area NDA on the substrate SUB. In an embodiment, for example, the common voltage line ELVSL may be disposed to surround at least a part of the display area DA. At least a part of the common voltage line ELVSL may be connected to the pad portion PDP.

The common voltage line ELVSL may provide a common voltage (e.g., a common voltage ELVSS of FIG. 3) to the plurality of pixels PX. In detail, the common voltage line ELVSL may be electrically connected to a common electrode (e.g., a common electrode CME of FIG. 4) in the non-display area NDA to provide the common voltage to the common electrode.

The first crack detection portion M1 and the second crack detection portion M2 may be disposed in the non-display area NDA on the substrate SUB. The first crack detection portion M1 may be disposed in the non-display area NDA adjacent to the left side and above the display area DA, and the second crack detection portion M2 may be disposed in the non-display area NDA adjacent to the right side and above the display area DA.

The first crack detection portion M1 may include a first crack detection line MCD1a and a second crack detection line MCD2a. The second crack detection portion M2 may include a first crack detection line MCD1b and a second crack detection line MCD2b. One end of each of the first crack detection lines MCD1a and MCD1b may be electrically connected to the crack detection circuit portion MCDP, and the other end of each of the first crack detection lines MCD1a and MCD1b may be electrically connected to one end of the corresponding one of the second crack detection lines MCD2a and MCD2b. In addition, the other end of each of the second crack detection lines MCD2a and MCD2b may be electrically connected to the pad portion PDP. A test voltage (e.g., a high voltage) may be applied to the second crack detection line MCD2a and MCD2b through the pad portion PDP.

At least a part of each of the first crack detection lines MCD1a and MCD1b and the second crack detection lines MCD2a and MCD2b may extend parallel to the edge of the display area DA. The second crack detection lines MCD2a and MCD2b disposed in the non-display area NDA adjacent to the left and right sides of the display area DA may be positioned between the first crack detection lines MCD1a and MCD1b and the first and second drivers DV1 and DV2 in a plan view.

The crack detection circuit portion MCDP may be disposed in the sub area SA on the substrate SUB. Specifically, the crack detection circuit portion MCDP may be positioned between the bending area BA and the pad area PDA in the plan view. The crack detection circuit portion MCDP may include a plurality of switching elements. The crack detection circuit portion MCDP may detect defects such as cracks occurring in the non-display area NDA through resistance changes of the first and second crack detection portions M1 and M2. Changes in the resistance of the first and second crack detection portions M1 and M2 may be confirmed by examining the lighting state of the display area DA through the crack detection circuit portion MCDP.

In this specification, a plane may be defined as the first direction DR1 and the second direction DR2 crossing the first direction DR1. In an embodiment, for example, the first direction DR1 may be perpendicular to the second direction DR2.

Figure 3:
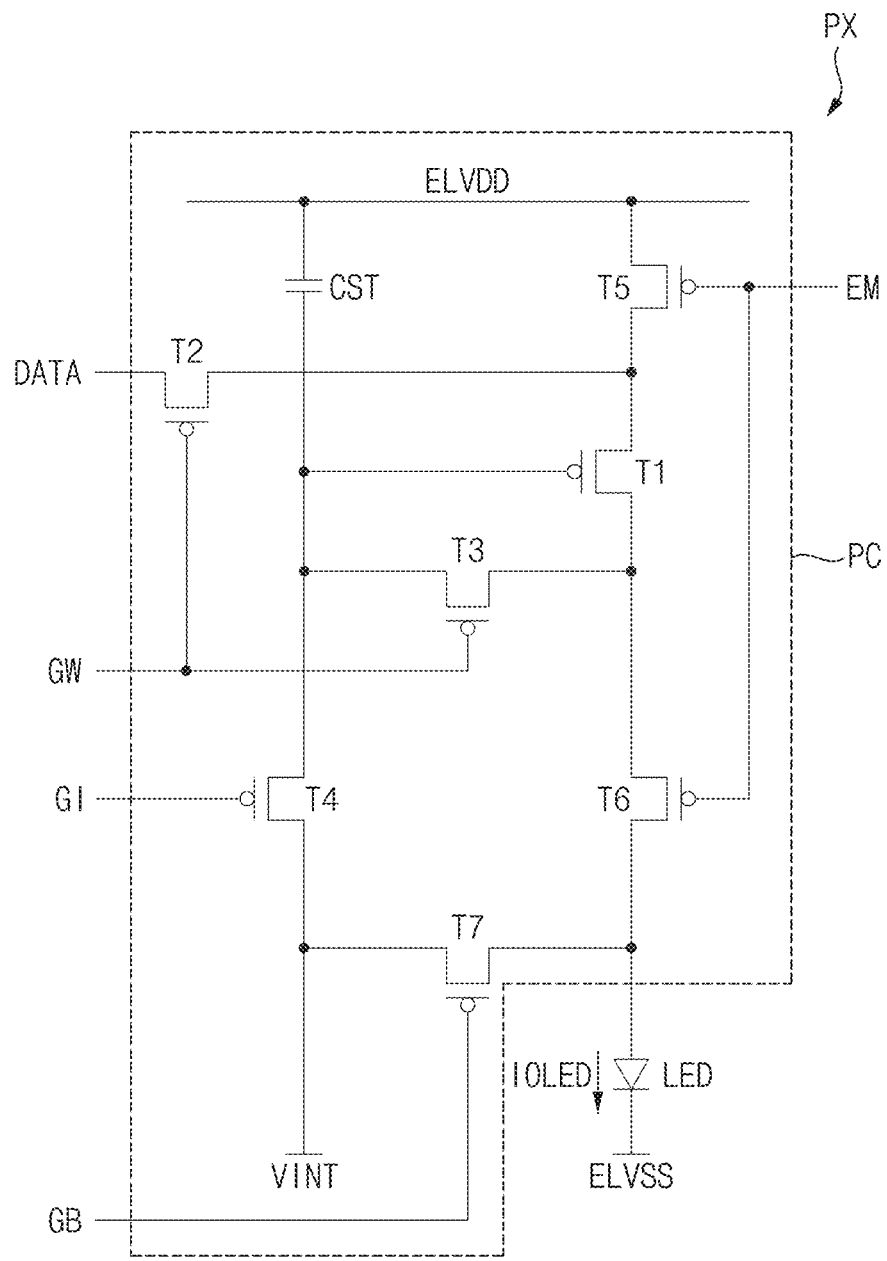
FIG. 3 is an equivalent circuit diagram illustrating each pixel arranged in the display area of FIG. 1.

FIG. 3 is an equivalent circuit diagram illustrating each pixel arranged in the display area of FIG. 1.

Referring to FIG. 3, each pixel PX may include a pixel circuit PC and a light emitting element LED electrically connected to the pixel circuit PC. Here, the pixel circuit PC may include first, second, third, fourth, fifth, sixth, and seventh transistors T1, T2, T3, T4, T5, T6, and T7 and a storage capacitor CST.

The light emitting element LED may output light based on a driving current IOLED. The light emitting element LED may include a first terminal and a second terminal. For example, the second terminal of the light emitting element LED may receive the common voltage ELVSS. In an embodiment, for example, the first terminal of the light emitting element LED may be an anode terminal, and the second terminal of the light emitting element LED may be a cathode terminal. Alternatively, the first terminal of the light emitting element LED may be a cathode terminal, and the second terminal of the light emitting element LED may be an anode terminal.

The first transistor T1 may include a gate terminal, a first terminal, and a second terminal. In an embodiment, for example, the first terminal of the first transistor T1 may be a source terminal, and the second terminal of the first transistor T1 may be a drain terminal. Alternatively, the first terminal of the first transistor T1 may be a drain terminal, and the second terminal of the first transistor T1 may be a source terminal. This may be equally applied to the second, third, fourth, fifth, sixth, and seventh transistors T2, T3, T4, T5, T6, and T7 to be described below. Therefore, in the following, descriptions related to this will be omitted.

The first transistor T1 may generate driving current IOLED. In an embodiment, the first transistor T1 may be defined as a driving transistor for driving the pixel PX. The first transistor T1 may generate the driving current IOLED based on a voltage difference between the gate terminal and the source terminal. In addition, a gray scale may be expressed in the pixels PX based on the magnitude of the driving current IOLED supplied to the light emitting element LED.

The second transistor T2 may include a gate terminal, a first terminal, and a second terminal. The gate terminal of the second transistor T2 may receive a first scan signal GW. The first terminal of the second transistor T2 may receive a data voltage DATA. The second terminal of the second transistor T2 may be connected to the first terminal of the first transistor T1. The second transistor T2 may be defined as a switching transistor.

The second transistor T2 may supply the data voltage DATA to the first terminal of the first transistor T1 during an activation period of the first scan signal GW. Conversely, the second transistor T2 may block the supply of the data voltage DATA during an inactive period of the first scan signal GW.

The third transistor T3 may include a gate terminal, a first terminal, and a second terminal. The gate terminal of the third transistor T3 may receive the first scan signal GW. A first terminal of the third transistor T3 may be connected to the second terminal of the first transistor T1. The second terminal of the third transistor T3 may be connected to the gate terminal of the first transistor T1.

The fourth transistor T4 may include a gate terminal, a first terminal, and a second terminal. The gate terminal of the fourth transistor T4 may receive a data initialization signal GI. The first terminal of the fourth transistor T4 may receive an initialization voltage VINT. The second terminal of the fourth transistor T4 may be connected to the second terminal of the third transistor T3.

The fourth transistor T4 may supply the initialization voltage VINT to the second terminal of the third transistor T3 during the activation period of the data initialization signal GI. That is, the fourth transistor T4 may initialize the second terminal of the third transistor T3 to the initialization voltage VINT during an activation period of the data initialization signal GI.

The fifth transistor T5 may include a gate terminal, a first terminal, and a second terminal. The gate terminal of the fifth transistor T5 may receive a light emitting control signal EM. The first terminal of the fifth transistor T5 may receive a driving voltage ELVDD. The second terminal of the fifth transistor T5 may be connected to the first terminal of the first transistor T1.

The fifth transistor T5 may supply the driving voltage ELVDD to the first terminal of the first transistor T1 during an activation period of the light emitting control signal EM. Contrary to this, the fifth transistor T5 may block the supply of the driving voltage ELVDD during an inactive period of the light emitting control signal EM.

The sixth transistor T6 may include a gate terminal, a first terminal, and a second terminal. The gate terminal of the sixth transistor T6 may receive the light emitting control signal EM. The first terminal of the sixth transistor T6 may be connected to the second terminal of the first transistor T1. The second terminal of the sixth transistor T6 may be connected to the first terminal of the light emitting element LED.

The sixth transistor T6 may supply the driving current IOLED generated by the first transistor T1 to the light emitting element LED during an activation period of the light emitting control signal EM. Contrary to this, the sixth transistor T6 may electrically separate the first transistor T1 and the light emitting element LED from each other during the inactive period of the light emitting control signal EM.

The seventh transistor T7 may include a gate terminal, a first terminal, and a second terminal. The gate terminal of the seventh transistor T7 may receive a second scan signal GB. The first terminal of the seventh transistor T7 may receive the initialization voltage VINT. The second terminal of the seventh transistor T7 may be connected to the first terminal of the light emitting element LED.

The seventh transistor T7 may supply the initialization voltage VINT to the first terminal of the light emitting element LED during the activation period of the second scan signal GB. That is, the seventh transistor T7 may initialize the first terminal of the light emitting element LED to the initialization voltage VINT during an activation period of the second scan signal GB.

The storage capacitor CST may include a first terminal and a second terminal. The first terminal of the storage capacitor CST may receive the driving voltage ELVDD. The second terminal of the storage capacitor CST may be connected to the gate terminal of the first transistor T1.

However, although the pixel circuit PC has been described as including seven transistors and one storage capacitor with reference to FIG. 3, embodiments of the present disclosure are not limited thereto. For another example, the pixel circuit PC may have a configuration including at least one transistor and at least one storage capacitor.

Figure 4:
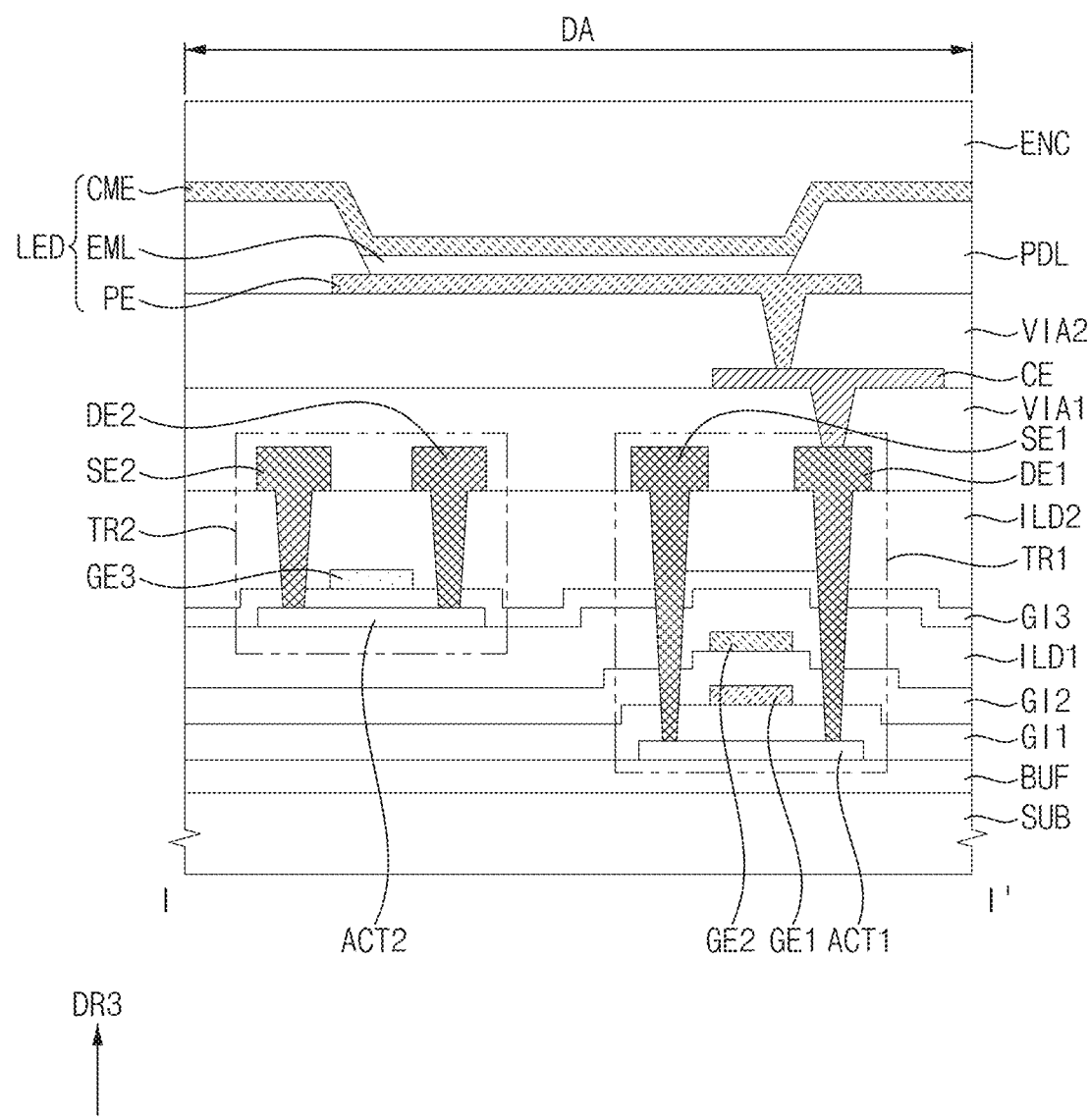
FIG. 4 is a cross-sectional view taken along line I-I' of FIG. 1.

FIG. 4 is a cross-sectional view taken along line I-I' of FIG. 1. For example, FIG. 4 is a cross-sectional view illustrating a part of the display area DA of FIG. 1.

Referring to FIG. 4, the display device DD according to an embodiment may include the substrate SUB, a buffer layer BUF, a first transistor TR1, a second transistor TR2, first, second, and third gates. insulating layers GI1, GI2, and GI3, first and second interlayer-insulating layers ILD1 and ILD2, a first via-insulating layer VIA1, a second via-insulating layer VIA2, a connection electrode CE, a pixel defining layer PDL, the light emitting element LED, and an encapsulation layer ENC.

Here, the first transistor TR1 may include a first active pattern ACT1, a first gate electrode GE1, a second gate electrode GE2, a first source electrode SE1, and a first drain electrode DE1. The second transistor TR2 may include a second active pattern ACT2, a third gate electrode GE3, a second source electrode SE2, and a second drain electrode DE2. In addition, the light emitting element LED may include a pixel electrode PE, a light emitting layer EML, and a common electrode CME.

The substrate SUB may include a transparent material or an opaque material. The substrate SUB may be made of a transparent resin substrate. Examples of the transparent resin substrate may include polyimide substrate and the like. In this case, the polyimide substrate may include a first organic layer, a first barrier layer, a second organic layer, and the like. Alternatively, the substrate SUB may include a quartz substrate, a synthetic quartz substrate, a calcium fluoride substrate, an F-doped quartz substrate, a soda-lime glass substrate, a non-alkali glass substrate, or the like. These may be used alone or in combination with each other.

The buffer layer BUF may be disposed on the substrate SUB. The buffer layer BUF may prevent diffusion of metal atoms or impurities from the substrate SUB into the first and second transistors TR1 and TR2. In addition, the buffer layer BUF may improve flatness of the surface of the substrate SUB when the surface of the substrate SUB is not uniform. In an embodiment, for example, the buffer layer BUF may include an inorganic material such as silicon oxide, silicon nitride, silicon oxynitride, and the like. These may be used alone or in combination with each other.

The first active pattern ACT1 may be disposed on the buffer layer BUF. In an embodiment, the first active pattern ACT1 may include an inorganic semiconductor such as amorphous silicon or polycrystalline silicon. In an embodiment, for example, the first active pattern ACT1 may have a first source region, a first drain region, and a first channel region positioned between the first source region and the first drain region.

The first gate insulating layer GI1 may be disposed on the buffer layer BUF. The first gate insulating layer GI1 may cover the first active pattern ACT1 and may be disposed along the profile of the first active pattern ACT1 to have a uniform thickness. Alternatively, the first gate insulating layer GI1 may sufficiently cover the first active pattern ACT1 and may have a substantially flat upper surface without creating a step around the first active pattern ACT1. In an embodiment, for example, the first gate insulating layer GI1 includes an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. These may be used alone or in combination with each other.

The first gate electrode GE1 may be disposed on the first gate insulating layer GI1. The first gate electrode GE1 may overlap the first channel region of the first active pattern ACT1 in a plan view. The first gate electrode GE1 may include a metal, an alloy, a metal nitride, a conductive metal oxide, a transparent conductive material, or the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. Examples of the conductive metal oxide may include indium tin oxide, indium zinc oxide, or the like. In addition, examples of the metal nitride may include aluminum nitride ($AlN_x$), tungsten nitride ($WN_x$), chromium nitride ($CrN_x$), or the like. Each of these may be used alone or in combination with each other.

The second gate insulating layer GI2 may be disposed on the first gate insulating layer GI1. The second gate insulating layer GI2 may cover the first gate electrode GE1 and may be disposed along the profile of the first gate electrode GE1 to have uniform thickness. Alternatively, the second gate insulating layer GI2 may sufficiently cover the first gate electrode GE1 and may have a substantially flat upper surface without creating a step around the first gate electrode GE1. In an embodiment, for example, the second gate insulating layer GI2 may include an inorganic material such as silicon oxide, silicon nitride, silicon oxynitride, and the like. These may be used alone or in combination with each other.

The second gate electrode GE2 may be disposed on the second gate insulating layer GI2. The second gate electrode GE2 may overlap the first gate electrode GE1 in a plan view. In an embodiment, for example, the second gate electrode GE2 may include a metal, an alloy, a metal nitride, a conductive metal oxide, a transparent conductive material, or the like. These may be used alone or in combination with each other.

The first interlayer-insulating layer ILD1 may be disposed on the second gate insulating layer GI2. The first interlayer-insulating layer ILD1 may cover the second gate electrode GE2 and may be disposed along the profile of the second gate electrode GE2 to have a uniform thickness. Alternatively, the first interlayer-insulating layer ILD1 may sufficiently cover the second gate electrode GE2 and may have a substantially flat upper surface without creating a step around the second gate electrode GE2. In an embodiment, for example, the first interlayer-insulating layer ILD1 may include an inorganic material such as silicon oxide, silicon nitride, silicon oxynitride, and the like. These may be used alone or in combination with each other.

The second active pattern ACT2 may be disposed on the first interlayer-insulating layer ILD1. In an embodiment, the second active pattern ACT2 may include a metal oxide semiconductor. In an embodiment, for example, the second active pattern ACT2 may have a second source region, a second drain region, and a second channel region positioned between the second source region and the second drain region.

The metal oxide semiconductor may include a two-component compound ($AB_x$), a ternary compound ($AB_xC_y$), a four-component compound ($AB_xC_yD_z$), or the like containing indium (In), zinc (Zn), gallium (Ga), tin (Sn), titanium (Ti), aluminum (Al), hafnium (Hf), zirconium (Zr), magnesium (Mg), or the like. In an embodiment, for example, the metal oxide semiconductor may include zinc oxide ($ZnO_x$), gallium oxide ($GaO_x$), tin oxide ($SnO_x$), indium oxide ($InO_x$), indium gallium oxide ("IGO"), indium zinc oxide ("IZO"), indium tin oxide. ("ITO"), indium zinc tin oxide ("IZTO"), indium gallium zinc oxide ("IGZO"), or the like. These may be used alone or in combination with each other.

The third gate insulating layer GI3 may be disposed on the first interlayer-insulating layer ILD1. The third gate insulating layer GI3 may cover the second active pattern ACT2 and may be disposed along the profile of the second active pattern ACT2 to have a uniform thickness. Alternatively, the third gate insulating layer GI3 may sufficiently cover the second active pattern ACT2 and may have a substantially flat upper surface without creating a step around the second active pattern ACT2. In an embodiment, for example, the third gate insulating layer GI3 may include an inorganic material such as silicon oxide, silicon nitride, silicon oxynitride, and the like. These may be used alone or in combination with each other.

The third gate electrode GE3 may be disposed on the third gate insulating layer GI3. The third gate electrode GE3 may overlap the second channel region of the second active pattern ACT2 in a plan view. In an embodiment, for example, the third gate electrode GE3 may include a metal, an alloy, a metal nitride, a conductive metal oxide, a transparent conductive material, or the like. These may be used alone or in combination with each other.

The second interlayer-insulating layer ILD2 may be disposed on the third gate insulating layer GI3. The second interlayer-insulating layer ILD2 may sufficiently cover the third gate electrode GE3 and may have a substantially flat upper surface without creating a step around the third gate electrode GE3. Alternatively, the second interlayer-insulating layer ILD2 may cover the third gate electrode GE3 and may be disposed along the profile of the third gate electrode GE3 to have a uniform thickness. In an embodiment, for example, the second interlayer-insulating layer ILD2 may include an inorganic material such as silicon oxide, silicon nitride, silicon oxynitride, and the like. These may be used alone or in combination with each other.

The first source electrode SE1 and the first drain electrode DE1 may be disposed on the second interlayer-insulating layer ILD2. The first source electrode SE1 may be connected to the first source region of the first active pattern ACT1 through a contact hole penetrating insulating layers (e.g., the first, second, and third gate insulating layers GI1, GI2, and GI3 and the first and second interlayer-insulating layers ILD1 and ILD2). The first drain electrode DE1 may be connected to the first drain region of the first active pattern ACT1 through a contact hole penetrating insulating layers (e.g., the first, second, and third gate insulating layers GI1, GI2, and GI3 and the first and second interlayer-insulating layers ILD1 and ILD2). In an embodiment, for example, the first source electrode SE1 and the first drain electrode DE1 may include a metal, an alloy, a metal nitride, a conductive metal oxide, a transparent conductive material, or the like. These may be used alone or in combination with each other.

The second source electrode SE2 and the second drain electrode DE2 may be disposed on the second interlayer-insulating layer ILD2. The second source electrode SE2 may be connected to the second source region of the second active pattern ACT2 through a contact hole penetrating the third gate insulating layer GI3 and the second interlayer-insulating layer ILD2. The second drain electrode DE2 may be connected to the second drain region of the second active pattern ACT2 through a contact hole penetrating the third gate insulating layer GI3 and the second interlayer-insulating layer ILD2. The second source electrode SE2 and the second drain electrode DE2 may include the same material as the first source electrode SE1 and the first drain electrode DE1 and may be disposed in the same layer as the first source electrode SE1 and the first drain electrode DE1.

Accordingly, the first transistor TR1 including the first active pattern ACT1, the first gate electrode GE1, the second gate electrode GE2, the first source electrode SE1, and the first drain electrode DE1 may be formed, and the second transistor TR2 including the second active pattern ACT2, the third gate electrode GE3, the second source electrode SE2 and the second drain electrode DE2 may be formed.

The first via-insulating layer VIA1 may be disposed on the second interlayer-insulating layer ILD2. The first via-insulating layer VIA1 may sufficiently cover the first source electrode SE1, the first drain electrode DE1, the second source electrode SE2, and the second drain electrode DE2. The first via-insulating layer VIA1 may include an organic material. In an embodiment, for example, the first via-insulating layer VIA1 may include an organic material such as polyimide resin, polyamide resin, siloxane resin, epoxy resin, and the like. These may be used alone or in combination with each other.

The connection electrode CE may be disposed on the first via-insulating layer VIA1. The connection electrode CE may be connected to the first drain electrode DE1 through a contact hole penetrating the first via-insulating layer VIA1. Accordingly, the connection electrode CE may electrically connect the first transistor TR1 and the light emitting element LED. In an embodiment, for example, the connection electrode CE may include a metal, a metal nitride, an alloy, a conductive metal oxide, a transparent conductive material, or the like. These may be used alone or in combination with each other.

The second via-insulating layer VIA2 may be disposed on the first via-insulating layer VIA1. The second via-insulating layer VIA2 may sufficiently cover the connection electrode CE. The second via-insulating layer VIA2 may have a substantially flat upper surface. The second via-insulating layer VIA2 may include an organic material. In an embodiment, for example, the second via-insulating layer VIA2 may include an organic material such as polyimide resin, polyamide resin, siloxane resin, epoxy resin, and the like. These may be used alone or in combination with each other.

The pixel electrode PE may be disposed on the second via-insulating layer VIA2. The pixel electrode PE may be connected to the connection electrode CE through a contact hole penetrating the second via-insulating layer VIA2. In an embodiment, for example, the pixel electrode PE may include a metal, an alloy, a metal nitride, a conductive metal oxide, a transparent conductive material, or the like. These may be used alone or in combination with each other. In an embodiment, for example, the pixel electrode PE may act as an anode.

The pixel defining layer PDL may be disposed on the second via-insulating layer VIA2. The pixel defining layer PDL may cover an edge of the pixel electrode PE. In an embodiment, for example, the pixel defining layer PDL may include an inorganic material and/or an organic material. In an embodiment, the pixel defining layer PDL may include an organic material such as an epoxy resin, a siloxane resin, and the like. These may be used alone or in combination with each other. In another embodiment, the pixel defining layer PDL may include an inorganic material and/or an organic material including a light blocking material containing black pigment, black dye, and the like.

The light emitting layer EML may be disposed on the pixel electrode PE. The light emitting layer EML may include an organic material that emits light of a predetermined color. In an embodiment, for example, the light emitting layer EML may include an organic material that emits at least one of red light, green light, and blue light.

The common electrode CME may be disposed on the pixel defining layer PDL and the light emitting layer EML. In an embodiment, for example, the common electrode CME may include a metal, an alloy, a metal nitride, a conductive metal oxide, a transparent conductive material, or the like. These may be used alone or in combination with each other. In an embodiment, for example, the common electrode CME may operate as a cathode.

Accordingly, the light emitting element LED including the pixel electrode PE, the light emitting layer EML, and the common electrode CME may be formed.

The encapsulation layer ENC may be disposed on the common electrode CME. The encapsulation layer ENC may prevent impurities, moisture, air, and the like from permeating the light emitting element LED from the outside. The encapsulation layer ENC may include at least one inorganic layer and at least one organic layer. In an embodiment, for example, the inorganic layer may include silicon oxide, silicon nitride, silicon oxynitride, or the like. These may be used alone or in combination with each other. The organic layer may include a polymer cured material such as polyacrylate and the like.

Figure 5:
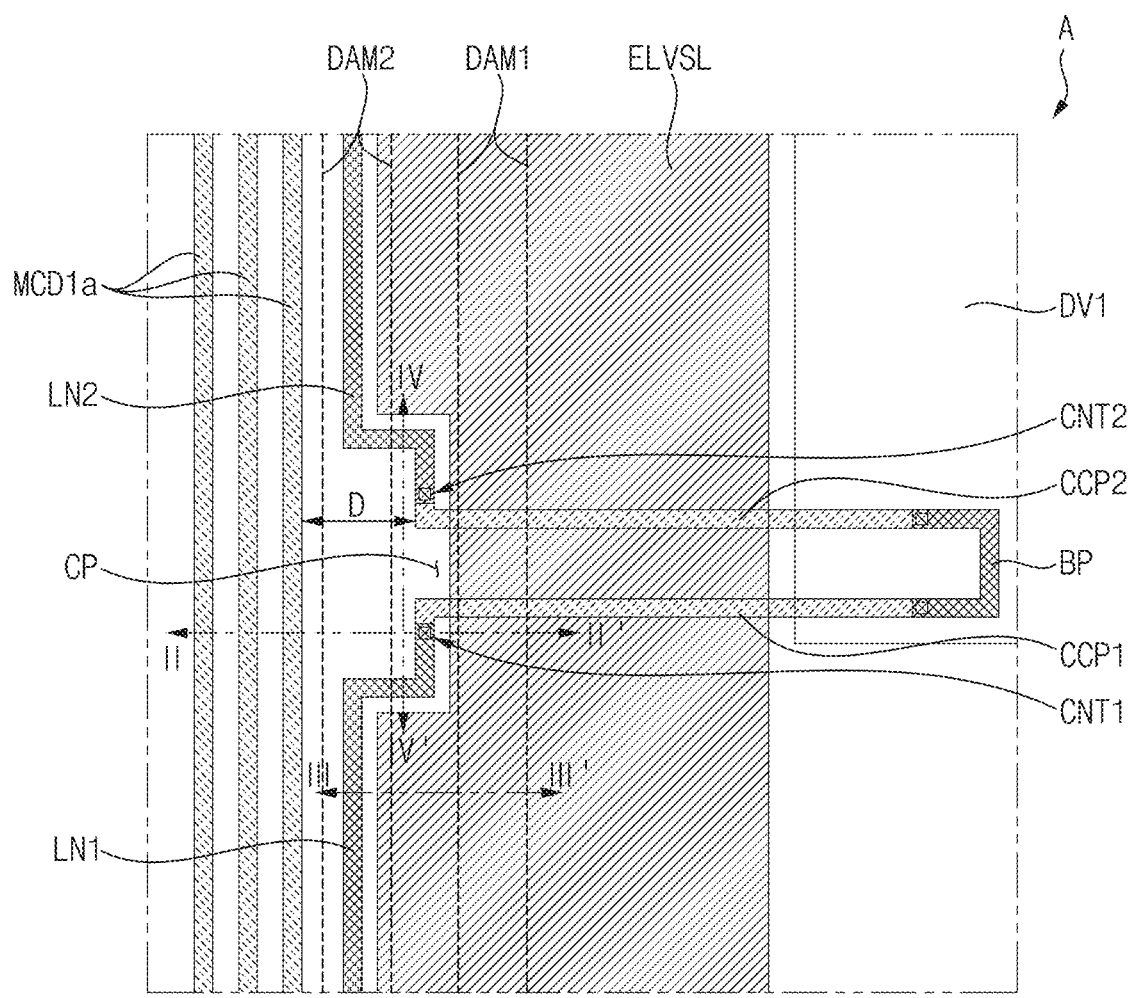
FIG. 5 is an enlarged plan view of area A of FIG. 1.

FIG. 5 is an enlarged plan view of area A of FIG. 1. For example, FIG. 5 is an enlarged plan view of a part of the non-display area NDA adjacent to the left side of the display area DA of FIG. 1. The planar structure shown in FIG. 5 may be substantially the same as a part of the non-display area NDA adjacent to the right side of the display area DA of FIG. 1.

Referring to FIGS. 1 and 5, the display device DD may include the first crack detection portion M1, the second crack detection portion M2, the common voltage line ELVSL, a first dam DAM1, a second dam DAM2, and the first driver DV1 disposed in the non-display area NDA on the substrate SUB.

The first crack detection portion M1 may include the first crack detection lines MCD1a and second crack detection lines MCD2a. The second crack detection portion M2 may include the first crack detection lines MCD1b and second crack detection lines MCD2b.

The number of first crack detection lines MCD1a may be plural. In an embodiment, for example, the number of first crack detection lines MCD1a may be three. However, embodiments of the present disclosure are not limited thereto, and various numbers of first crack detection lines MCD1a may be provided.

A part of the first crack detection line MCD1a may extend along the second direction DR2. In an embodiment, at least a part of the first crack detection line MCD1a adjacent to an end of the first driver DV1 may extend parallel to an edge of the substrate SUB. That is, at least the part of the first crack detection line MCD1a adjacent to the end of the first driver DV1 may not be bent.

Each of the first and second dams DAM1 and DAM2 may surround at least a part of the display area DA. The first and second dams DAM1 and DAM2 may block an organic material from flowing toward the edge of the substrate SUB when an organic layer of the encapsulation layer (e.g., the encapsulation layer ENC of FIG. 4) is formed.

The first dam DMA1 may be positioned between the first crack detection line MCD1a and the display area DA in the plan view. The second dam DMA2 may be positioned between the first crack detection line MCD1a and the first dam DAM1 in the plan view.

In an embodiment, a concave part CP overlapping at least a part of the second crack detection line MCD2a in the plan view may be defined at an edge of the common voltage line ELVSL facing the first crack detection line MCD1a.

In an embodiment, the common voltage line ELVSL may overlap an entirety of the first dam DAM1 and overlap a part of the second dam DAM2 in the plan view. In addition, the concave part CP may not overlap the first dam DAM1 and may partially overlap the second dam DAM2 in the plan view.

The second crack detection line MCD2a may include a first line part LN1, a second line part LN2, a first connection part CCP1, a second connection part CCP2, and a bridge pattern BP. The first line part LN1 may contact the first connection part CCP1 through a first contact hole CNT1, and the second line part LN2 may contact the second connection part CCP2 through a second contact hole CNT2.

The first connection part CCP1 may extend in the first direction DR1, and the second connection part CCP2 may extend in the first direction DR1.

In an embodiment, the first and second contact holes CNT1 and CNT2 may be positioned between the first and second dams DAM1 and DAM2. In other words, the first and second contact holes CNT1 and CNT2 may overlap the concave part CP in the plan view.

The first and second connection parts CCP1 and CCP2 may be connected to each other through the bridge pattern BP. In an embodiment, each of the first and second connection parts CCP1 and CCP2 may contact the bridge pattern BP through a contact hole in the first driver DV1.

In an embodiment, each of the first and second line parts LN1 and LN2 may at least partially overlap the second dam DAM2 and may not overlap the first dam DAM1 in the plan view.

As described above, the concave part CP may overlap at least a part of the second crack detection line MCD2a in a plan view. Specifically, the concave part CP may overlap at least a part of each of the first and second line parts LN1 and LN2 in a plan view. In this case, one side of each of the first and second line parts LN1 and LN2 may be bent in a direction from the second dam DAM2 toward the first dam DAM1 inside the concave part CP.

The first and second connection parts CCP1 and CCP2 may be spaced apart from the first crack detection line MCD1a by a predetermined distance in the plan view. In an embodiment, for example, a shortest distance D between the first connection part CCP1 or the second connection part CCP2 and the first crack detection line MCD1a may be about 50 micrometers. Accordingly, defects due to electrostatic discharge ("ESD") occurring in the first and second connection parts CCP1 and CCP2 can be improved.

Figure 6:
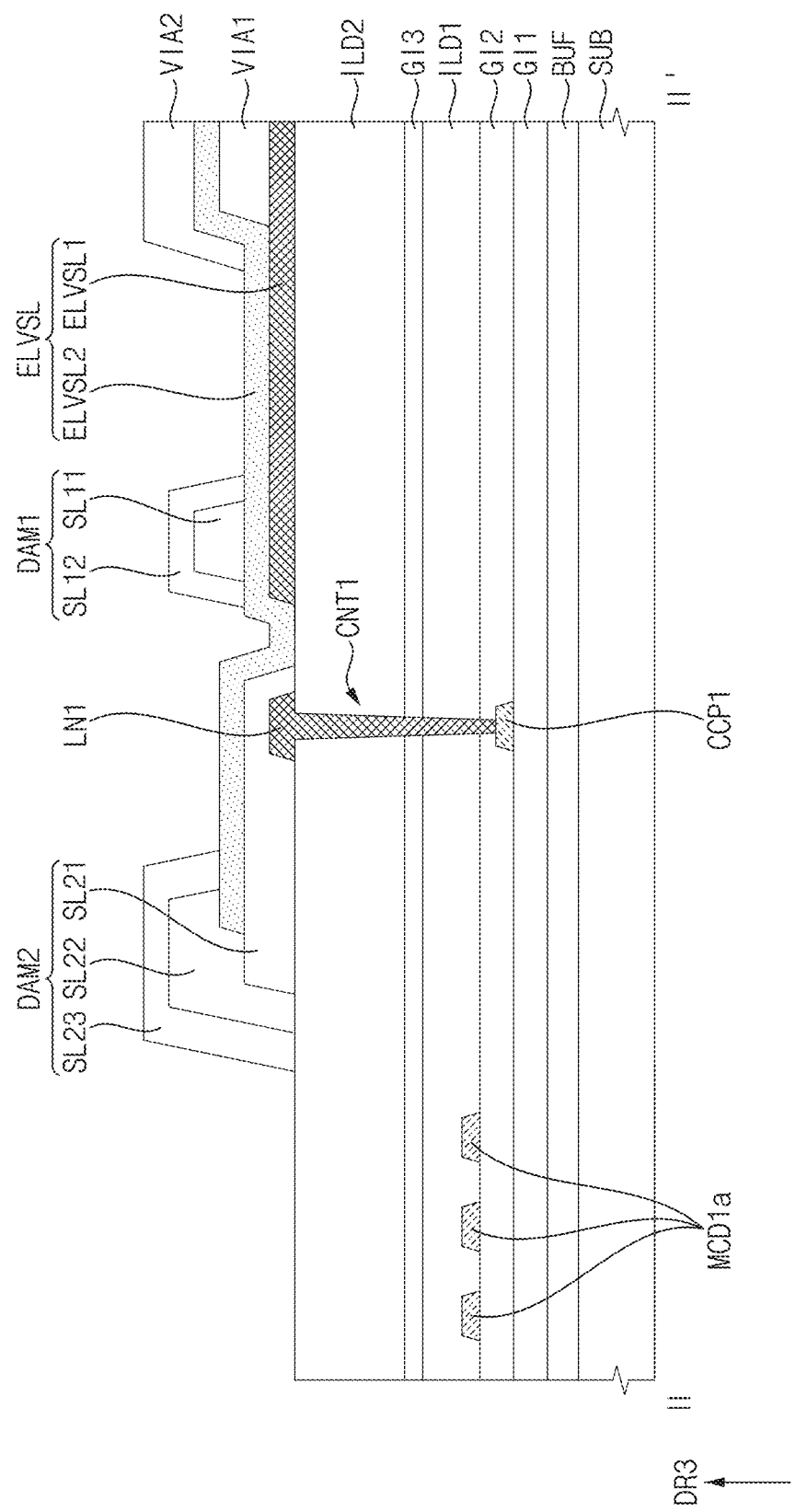
FIG. 6 is a cross-sectional view taken along line II-II' of FIG. 5.
Figure 7:
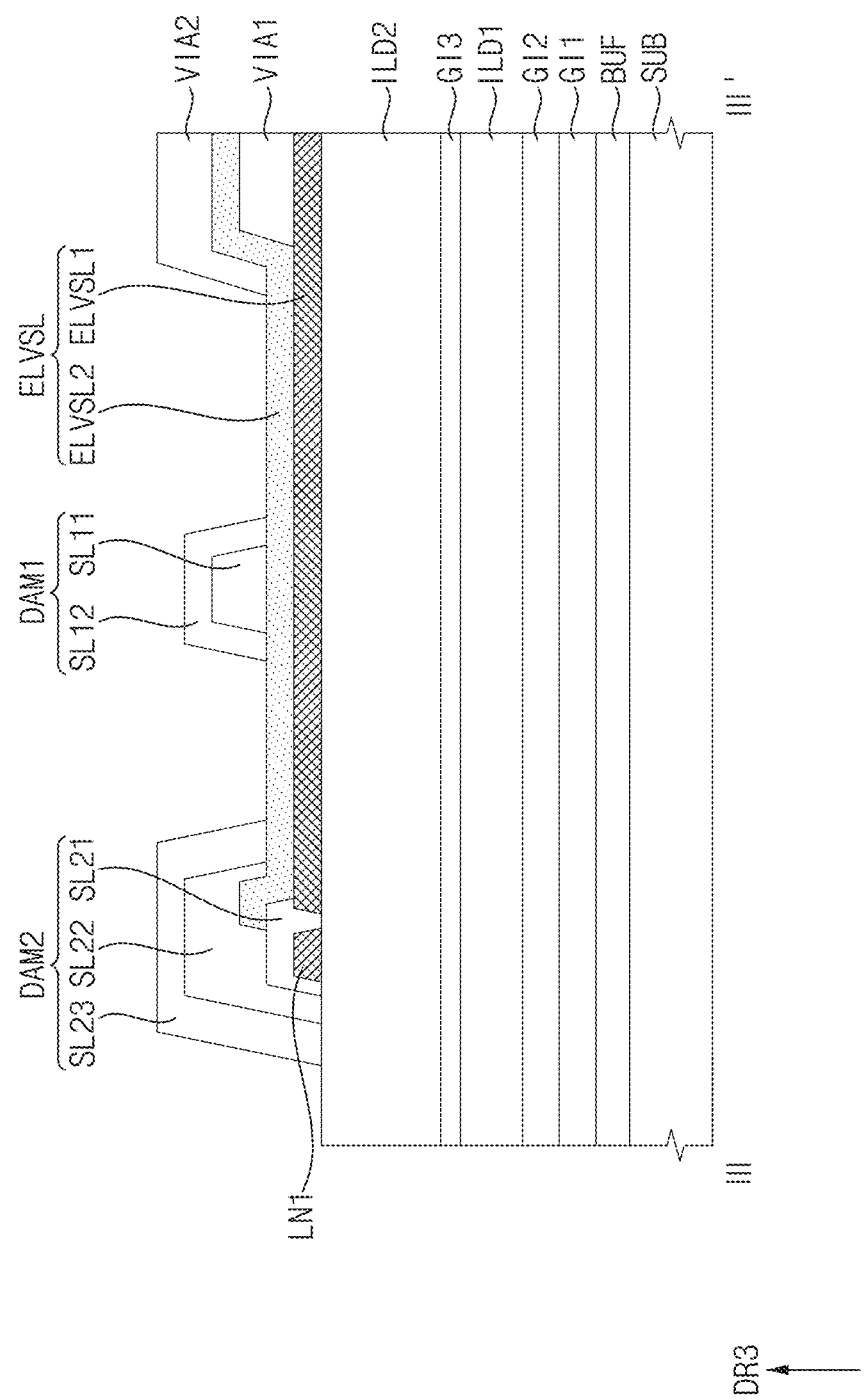
FIG. 7 is a cross-sectional view taken along line III-III' of FIG. 5.
Figure 8:
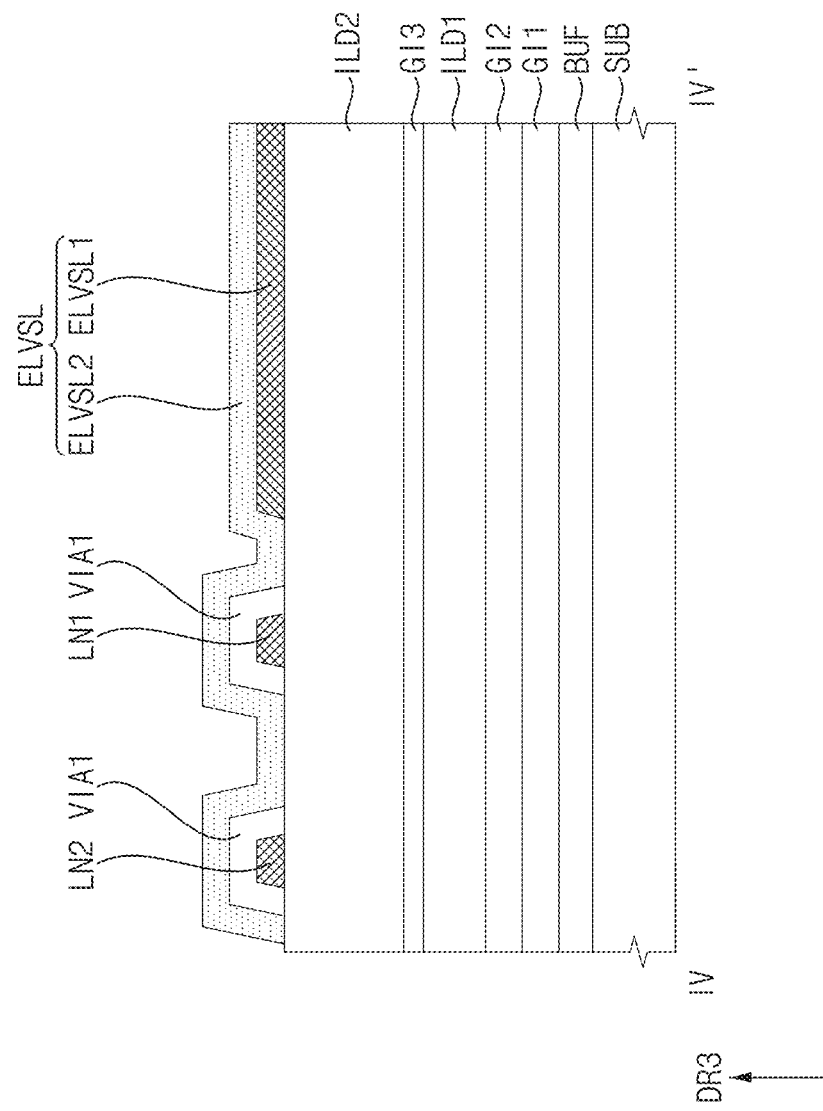
FIG. 8 is a cross-sectional view taken along line IV-IV' of FIG. 5.

FIG. 6 is a cross-sectional view taken along line II-II' of FIG. 5. FIG. 7 is a cross-sectional view taken along line III-III' of FIG. 5. FIG. 8 is a cross-sectional view taken along line IV-IV' of FIG. 5.

Hereinafter, descriptions overlapping those of the display device DD described with reference to FIGS. 1 and 4 will be omitted or simplified.

Referring to FIG. 6, when the number of the first crack detection line MCD1a is plural, the first crack detection lines MCD1a may be disposed in the same layer. In an embodiment, the first crack detection line MCD1a may be disposed in the same layer as a second gate electrode (e.g., the second gate electrode GE2 of FIG. 4). That is, the first crack detection line MCD1a may be formed using the same material as the second gate electrode through the same process. However, embodiments of the present disclosure are not limited thereto. In an embodiment, for example, the first crack detection line MCD1a may be disposed in the same layer as a first gate electrode (e.g., the first gate electrode GE1 of FIG. 4) or a third gate electrode (e.g., the third gate electrode GE3 of FIG. 4) in another embodiment.

Alternatively, when the number of the first crack detection line MCD1a is plural, the first crack detection lines MCD1a may be disposed in different layers.

The first and second connection parts CCP1 and CCP2 may be disposed on the first gate insulating layer GI1. In an embodiment, the first and second connection parts CCP1 and CCP2 may be disposed in the same layer as the first gate electrode. That is, the first and second connection parts CCP1 and CCP2 may be formed using the same material as the first gate electrode through the same process.

The first and second line parts LN1 and LN2 may be disposed on the second interlayer-insulating layer ILD2. In an embodiment, the first and second line parts LN1 and LN2 may be disposed in the same layer as a source electrode (e.g., the first and second source electrodes SE1 and SE2 of FIG. 4) and a drain electrode (e.g., the first and second drain electrodes DE1 and DE2 of FIG. 4). That is, the first and second line parts LN1 and LN2 may be formed using the same material as the source electrode and the drain electrode through the same process.

Further referring to FIGS. 7 and 8, the first dam DAM1 and the second dam DAM2 may be disposed on the second interlayer-insulating layer ILD2. Each of the first dam DAM1 and the second dam DAM2 may include a plurality of sub-layers. In an embodiment, for example, the first dam DAM1 may include a first sub-layer SL11 and a second sub-layer SL12 disposed on the first sub-layer SL11. The second dam DAM2 may include a first sub-layer SL21, a second sub-layer SL22 disposed on the first sub-layer SL21, and a third sub-layer SL23 disposed on the second sub-layer SL22.

The first sub-layer SL11 of the first dam DAM1 may include the same material as the second via-insulating layer VIA2, and the second sub-layer SL12 of the first dam DAM1 may include the same material as a pixel defining layer (e.g., the pixel defining layer PDL of FIG. 4). In addition, the first sub-layer SL21 of the second dam DAM2 may include the same material as the first via-insulating layer VIA1, the second sub-layer SL22 of the second dam DAM2 may include the same material as the second via-insulating layer VIA2, and the third sub-layer SL23 of the second dam DAM2 may include the same material as the pixel defining layer. That is, each of the first and second sub-layers SL11 and SL12 of the first dam DAM1 may include an organic material, and each of the first, second, and third sub-layers SL21, SL22, and SL23 of the second dam DAM2 may include an organic material.

The second dam DAM2 may cover at least a part of each of the first and second line parts LN1 and LN2. Specifically, each of the first and second line parts LN1 and LN2 may be covered by the first sub-layer SL21 of the second dam DAM2 and an organic layer (i.e., the first via-insulating layer VIA1). Here, the first sub-layer SL21 of the second dam DAM2 and the organic layer may be integrally formed. Even if each of the first and second line parts LN1 and LN2 is covered with the first sub-layer SL21 of the second dam DAM2 and the organic layer, the first dam DAM1 and the second dam DAM2 may be not connected. Accordingly, the first and second dams DAM1 and DAM2 may not be provided as a moisture permeation path.

In an embodiment, any one among the sub-layers of the second dam DAM2 may overlap the first and second contact holes CNT1 and CNT2 in a plan view. In other words, any one among the sub-layers of the second dam DAM2 may extend to cover the first and second contact holes CNT1 and CNT2. In an embodiment, the first sub-layer SL21 of the second dam DAM2 may extend to cover the first and second contact holes CNT1 and CNT2.

The common voltage line ELVSL may be disposed on the second interlayer-insulating layer ILD2. The common voltage line ELVSL may have a multilayer structure. In an embodiment, for example, the common voltage line ELVSL may include a first layer ELVSL1 and a second layer ELVSL2 disposed on the first layer ELVSL1. In an embodiment, the first layer ELVSL1 may be disposed in the same layer as the source electrode and the drain electrode, and the second layer ELVSL2 may be disposed in the same layer as a connection electrode (e.g., the connection electrode CE of FIG. 4). That is, the first layer ELVSL1 may be formed using the same material as the source electrode and the drain electrode through the same process and the second layer ELVSL2 may be formed using the same material as the connection electrode through the same process.

In an embodiment, the concave part CP may be defined only in the first layer ELVSL1 of the common voltage line ELVSL. That is, the second layer ELVSL2 of the common voltage line ELVSL may overlap the first and second contact holes CNT1 and CNT2 in the plan view. In other words, the second layer ELVS2 of the common voltage line ELVSL may overlap at least a part of each of the first and second line parts LN1 and LN2 in a plan view. Accordingly, reduction in power consumption of the display device DD can be minimized.

The display device DD according to an embodiment of the present disclosure may include the plurality of first crack detection lines MCD1a disposed in the non-display area NDA, the first dam DAM1 positioned between the first crack detection lines MCD1a and the display area DA, the second dam DAM2 positioned between the first dam DAM1 and the first crack detection lines MCD1a and including a plurality of sub-layers, the common voltage line ELVSL, the concave part CP defined at an edge of the common voltage line ELVSL facing the first crack detection lines MCD1a, and the second crack detection line MCD2a electrically connected to the first crack detection lines MCD1a and including a line part and a connection part contacting the line part through a contact hole overlapping one of the sub-layers in a plan view. Accordingly, defects due to electrostatic discharge generated in a crack detection line can be effectively improved. In addition, the dead space of the display device DD can be effectively reduced.

Figure 9:
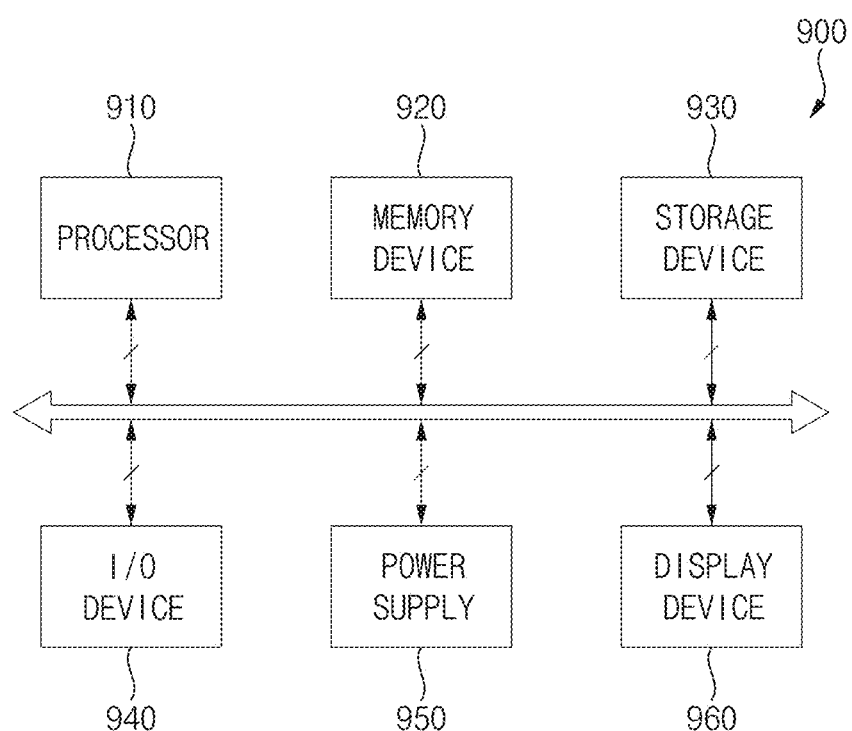
FIG. 9 is a block diagram illustrating an electronic device including the display device of FIG. 1.
Figure 10:
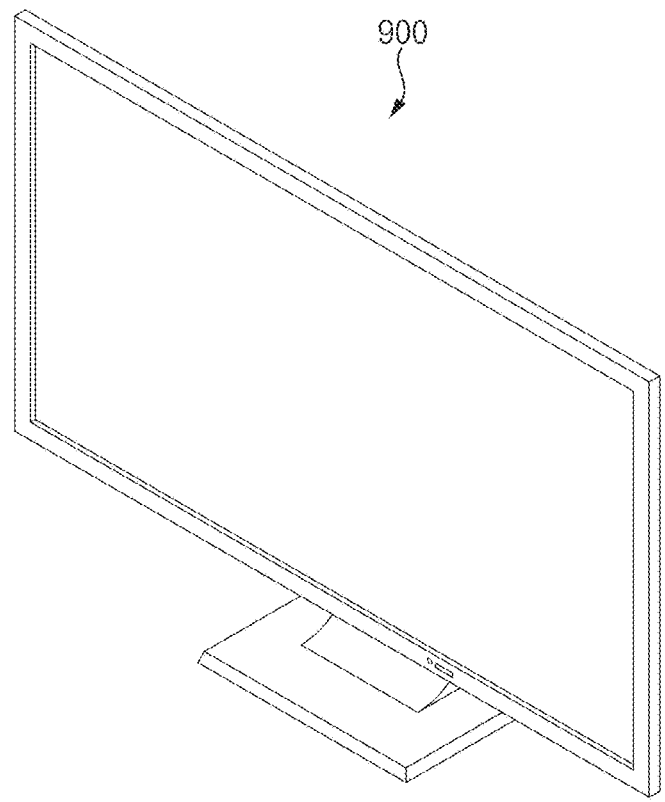
FIG. 10 is a view illustrating an example in which the electronic device of FIG. 9 is implemented as a television.
Figure 11:
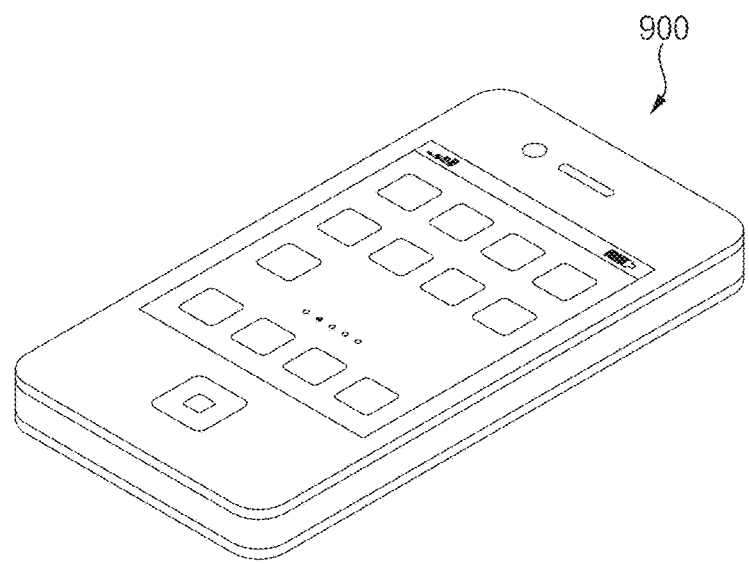
FIG. 11 is a view illustrating an example in which the electronic device of FIG. 9 is implemented as a smart phone.

FIG. 9 is a block diagram illustrating an electronic device including the display device of FIG. 1. FIG. 10 is a view illustrating an example in which the electronic device of FIG. 9 is implemented as a television. FIG. 11 is a view illustrating an example in which the electronic device of FIG. 9 is implemented as a smart phone.

Referring to FIGS. 9, 10, and 11, in an embodiment, an electronic device 900 may include a processor 910, a memory device 920, a storage device 930, an input/output ("I/O") device 940, a power supply 950, and a display device 960. In this case, the display device 960 may correspond to the display device DD described with reference to FIGS. 1 to 8. The electronic device 900 may further include several ports capable of communicating with a video card, a sound card, a memory card, a USB device, or the like.

In an embodiment, as shown in FIG. 10, the electronic device 900 may be implemented as a television. In another embodiment, as shown in FIG. 11, the electronic device 900 may be implemented as a smart phone. However, the electronic device 900 is not limited thereto, and for another example, the electronic device 900 may be implemented as a mobile phone, a video phone, a smart pad, a smart watch, a tablet PC, a vehicle navigation device, a computer monitor, a laptop computer, a head mounted display ("HMD"), or the like.

The processor 910 may perform certain calculations or tasks. In an embodiment, the processor 910 may be a microprocessor, a central processing unit ("CPU"), an application processor ("AP"), and/or the like. The processor 910 may be connected to other components through an address bus, a control bus, a data bus, or the like. The processor 910 may also be connected to an expansion bus, such as a peripheral component interconnect ("PCI") bus.

The memory device 920 may store data necessary for the operation of the electronic device 900. In an embodiment, for example, the memory device 920 may include an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a non-volatile memory device such as a ferroelectric random access memory ("FRAM") device and/or a volatile memory device such as a dynamic random access memory ("DRAM") device, a static random access memory ("SRAM") device, and a mobile DRAM device, or the like.

The storage device 930 may include a solid state drive ("SSD"), a hard disk drive ("HDD"), a CD-ROM, or the like.

The input/output device 940 may include input means such as a keyboard, keypad, touch pad, touch screen, mouse, and the like and output means such as a speaker, a printer, or the like.

The power supply 950 may supply power necessary for the operation of the electronic device 900. The display device 960 may be connected to other components through buses or other communication links. In an embodiment, the display device 960 may be included in the input/output device 940.

The present disclosure can be applied to various display devices. For example, the present disclosure is applicable to various display devices such as display devices for vehicles, ships and aircraft, portable communication devices, display devices for exhibition or information transmission, medical display devices, or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
a substrate including a display area in which a plurality of pixels are arranged and a non-display area positioned around the display area;
a plurality of first crack detection lines disposed in the non-display area on the substrate;
a first dam positioned between the first crack detection lines and the display area;
a second dam positioned between the first dam and the first crack detection lines and including a plurality of sub-layers;
a common voltage line disposed in the non-display area on the substrate, and which provides a common voltage to the pixels, and includes a concave part defined at an edge of the common voltage line facing the first crack detection lines; and
a second crack detection line electrically connected to the first crack detection lines, positioned between the first crack detection lines and the display area, and including a first line part and a first connection part contacting the first line part through a first contact hole overlapping one of the sub-layers in a plan view.

2. The display device of claim 1, wherein the concave part overlaps at least a part of the second crack detection line in the plan view.

3. The display device of claim 1, wherein the common voltage line overlaps an entirety of the first dam and overlaps a part of the second dam in the plan view, and
the concave part does not overlap the first dame and partially overlaps the second dam in the plan view.

4. The display device of claim 1, wherein the second crack detection line further includes:
a second line part spaced apart from the first line part; and
a second connection part contacting the second line part through a second contact hole overlapping the one of the sub-layers in the plan view.

5. The display device of claim 4, wherein each of the first and second line parts at least partially overlaps the second dam and does not overlap the first dam in the plan view.

6. The display device of claim 4, further comprising:
a driver disposed in the non-display area on the substrate,
wherein the second crack detection line further includes a bridge pattern connecting the first connection part to the second connection part, and
each of the first and second connection parts contacts the bridge pattern through a contact hole in the driver.

7. The display device of claim 4, wherein the first and second contact holes overlap the concave part in the plan view.

8. The display device of claim 4, wherein the sub-layers of the second dam includes:
a first sub-layer;
a second sub-layer disposed on the first sub-layer; and
a third sub-layer disposed on the second sub-layer, and
each of the first, second, and third sub-layers includes an organic material.

9. The display device of claim 8, wherein the first sub-layer covers each of the first and second line parts.

10. The display device of claim 8, wherein the first sub-layer extends to cover the first and second contact holes.

11. The display device of claim 4, further comprising:
a first active pattern disposed in the display area on the substrate;
a first gate electrode disposed on the first active pattern;
a second gate electrode disposed on the first gate electrode;
a second active pattern disposed on the second gate electrode;
a third gate electrode disposed on the second active pattern;
a source electrode and a drain electrode disposed on the third gate electrode; and
a connection electrode disposed on the source electrode and the drain electrode.

12. The display device of claim 11, wherein each of the first and second line parts is disposed in a same layer as the source electrode and the drain electrode,
each of the first and second connection parts is disposed in a same layer as the first gate electrode, and
each of the first crack detection lines is disposed in a same layer as the second gate electrode.

13. The display device of claim 11, wherein the common voltage line includes:
a first layer disposed in a same layer as the source electrode and the drain electrode; and
a second layer disposed in a same layer as the connection electrode.

14. The display device of claim 13, wherein the concave part is defined only in the first layer of the common voltage line, and the second layer of the common voltage line overlaps the first and second contact holes in the plan view.

15. The display device of claim 1, wherein the first crack detection lines are disposed in a different layer from the second crack detection lines.

16. The display device of claim 1, wherein the first crack detection lines are disposed in a same layer as each other.

17. A display device comprising:
- a substrate including a display area in which a plurality of pixels are arranged and a non-display area positioned around the display area;
- a driver disposed in the non-display area on the substrate;
- a plurality of first crack detection lines disposed in the non-display area on the substrate, wherein at least a part of each of the first crack detection lines is adjacent to a side of the driver and extends in parallel with an edge of the substrate;
- a first dam positioned between the first crack detection lines and the display area;
- a second dam positioned between the first dam and the first crack detection lines and including a plurality of sub-layers;
- a common voltage line disposed in the non-display area on the substrate, and which provides a common voltage to the pixels, and includes a concave part defined at an edge of the common voltage line facing the first crack detection lines; and
- a second crack detection line electrically connected to the first crack detection lines, positioned between the first crack detection lines and the display area, and including a first line part and a first connection part contacting the first line part through a first contact hole overlapping one of the sub-layers in a plan view.

18. The display device of claim 17, wherein the common voltage line overlaps an entirety of the first dam and overlaps a part of the second dam in the plan view,
- the concave part overlaps at least a part of the second crack detection line in the plan view, and
- the concave part does not overlap the first dame and partially overlaps the second dam in the plan view.

19. The display device of claim 17, wherein the second crack detection line further includes:
- a second line part spaced apart from the first line part; and
- a second connection part contacting the second line part through a second contact hole overlapping the one of the sub-layers in the plan view.

20. The display device of claim 19, wherein the first and second contact holes overlap the concave part in the plan view.

* * * * *